(12) United States Patent
Sato et al.

(10) Patent No.: US 8,403,199 B2
(45) Date of Patent: Mar. 26, 2013

(54) LOCALIZED JET SOLDERING DEVICE AND PARTIAL JET SOLDERING METHOD

(75) Inventors: Issaku Sato, Tokyo (JP); Akira Takaguchi, Toyama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 13/257,936

(22) PCT Filed: Mar. 24, 2010

(86) PCT No.: PCT/JP2010/055125
§ 371 (c)(1),
(2), (4) Date: Sep. 23, 2011

(87) PCT Pub. No.: WO2010/110341
PCT Pub. Date: Sep. 30, 2010

(65) Prior Publication Data
US 2012/0006886 A1    Jan. 12, 2012

(30) Foreign Application Priority Data
Mar. 24, 2009    (JP) .................................. 2009-072724

(51) Int. Cl.
*B23K 3/06*    (2006.01)
*B23K 31/02*    (2006.01)
(52) U.S. Cl. ............................ 228/37; 228/256; 228/260
(58) Field of Classification Search .................. 228/37, 228/260, 256
See application file for complete search history.

(56) References Cited

U.S. PATENT DOCUMENTS
4,530,458 A * 7/1985 Kondo ........................ 228/180.1
(Continued)

FOREIGN PATENT DOCUMENTS
CN    1479568    3/2004
DE    60218950    12/2007
(Continued)

OTHER PUBLICATIONS
International Search Report for PCT/JP2010/055125, Jul. 6, 2010.
(Continued)

*Primary Examiner* — Devang R Patel
(74) *Attorney, Agent, or Firm* — Chernoff Vilhauer McClung & Stenzel LLP

(57) ABSTRACT

To enable the molten solder to be partially spouted onto a component-mounting member in a stable state without decreasing the revolutions of a pump which is difficult to set a spouted amount of molten solder, even if a nozzle having a small spouting opening is used in a partial-jet-solder bath.

As shown in FIG. 3, an automatic partial-jet-soldering apparatus 100 is provided with a solder bath 4 that has a nozzle base portion 44 and contains molten solder 7, a pump 5 that supplies the molten solder 7 contained in the solder bath 4 under a predetermined pressure to the nozzle base portion 44, plural nozzles 8a and the like that have predetermined solder-spouting areas and connect the nozzle base portion 44 to spout the molten solder 7 supplied from the pump 5 under the predetermined pressure so that it rises by its surface tension, and a dummy nozzle 32 that has a solder-spouting area more than that of any of the nozzles 8a and the like and connects the nozzle base portion 44 to spout the molten solder 7 supplied from the pump 5 under the predetermined pressure, wherein the dummy nozzle 32 is positioned on a position which is nearer the pump 5 than the nozzles 8a and the like.

13 Claims, 7 Drawing Sheets

U.S. PATENT DOCUMENTS

| | | | |
|---|---|---|---|
| 6,257,482 B1 * | 7/2001 | Koshi et al. | 228/260 |
| 6,510,978 B1 * | 1/2003 | Koshi et al. | 228/256 |
| 2003/0066866 A1 | 4/2003 | Takaguchi et al. | |
| 2004/0211816 A1 * | 10/2004 | Ogawa | 228/37 |
| 2008/0093417 A1 * | 4/2008 | Takaguchi et al. | 228/37 |
| 2009/0212094 A1 * | 8/2009 | Zen et al. | 228/260 |

FOREIGN PATENT DOCUMENTS

| | | |
|---|---|---|
| EP | 1293283 | 3/2003 |
| JP | 49-49159 A | 5/1974 |
| JP | 54100955 A | 8/1979 |
| JP | 1015995 A | 1/1989 |
| JP | 2000-200966 | 7/2000 |
| JP | 2002-368404 | 12/2002 |
| JP | 2003-78242 A | 3/2003 |
| JP | 2004-9127 A | 1/2004 |
| JP | 2005-028446 | 2/2005 |
| JP | 2005353719 A * | 12/2005 |
| JP | 2006055904 A * | 3/2006 |
| JP | 2008-109033 A | 5/2008 |
| SU | 707709 A2 | 1/1980 |

OTHER PUBLICATIONS

Supplementary European Search Report, EP10756137, completed Jul. 23, 2012, mailed Aug. 2, 2012, 4 pages.

* cited by examiner

LOCALIZED JET SOLDERING DEVICE AND PARTIAL JET SOLDERING METHOD

This is a national stage application filed under 35 USC 371 based on International Application No. PCT/JP2010/055125, filed Mar. 24, 2010, and claims priority under 35 USC 119 of Japanese Patent Application No. JP 2009-072724, filed Mar. 24, 2009.

TECHNICAL FIELD

The present invention relates to a partial-jet-soldering device and a partial-jet-soldering method, which are applicable to an automatic partial-jet-soldering apparatus that spouts molten solder to only desired positions in a printed circuit board and solders electronic components on the printed circuit board.

BACKGROUND ART

Soldering electronic components on a printed circuit board has previously been performed using an automatic soldering apparatus. On the automatic soldering apparatus, it is configured so that a fluxer, a preheater, a jet solder bath, a cooling apparatus and the like are arranged at their predetermined positions. In this automatic soldering apparatus, when soldering the electronic components on the printed circuit board, the fluxer applies flux over the entire back surface of the printed circuit board, the preheater preliminarily heats the printed circuit board, an entire jet solder bath solders the electronic components on the printed circuit board, and the cooling apparatus cools the molten solder, thereby finishing the soldering steps.

When soldering the printed circuit board on the back surface of which surface-mount components, connectors and the like are mounted by the automatic soldering apparatus having the above-mentioned entire jet solder bath, any issues occur in the surface-mount components, connectors and the like. For example, in the entire jet solder bath, the flux is applied to the entire back surface thereof, the entire back surface is preliminarily heated, and molten solder is then contacted with the entire back surface thereof.

Because of this, the surface-mount components mounted on the back surface thereof contact the molten solder which has become a high temperature so that failure in function, thermal damage brings about in them, and the molten solder enters into jack insert holes of the connectors mounted on the back surface thereof so that a bad contact occurs, which runs into a situation that they cannot be used at all as the connectors.

Accordingly, accompanying a miniaturization of electronic components, a partial-jet-soldering device has often been adapted which contacts the molten solder to only desired positions in the printed circuit board and can perform the soldering without exerting any thermal influence upon undesired positions therein.

In relation to such a partial-jet-soldering device, in a patent document 1, a partial-jet-soldering method for a printed circuit board and a partial-jet-soldering device therefor are disclosed. In the partial-jet-soldering device, a jet pump and many nozzles each having a tubular shape are arranged in a partial jet solder bath and at the inside thereof, the solder is kept its melted condition by a heater. Set-up positions of the nozzles are set so that they align a soldering group in the printed circuit board. In the partial jet solder bath using many nozzles, based on Pascal's principle, pressure applied to each nozzle from a solder sending path becomes identical at each nozzle position, which is a situation where pressure by which the molten solder is sent by the jet pump and pressure applied to all the nozzles are in balance with each other.

According to this partial-jet-soldering method, it is disclosed to mount the printed circuit board on the nozzles while many soldering groups in the printed circuit and many nozzles set in the partial jet solder bath board are aligned with each other, and then, to raise the molten solder in the nozzles inside the nozzles to contact it with the soldering groups in the printed circuit mounted on the nozzles and to circulate the molten solder in the nozzles. If the device is configured so as to do so, it is possible to obtain any soldered positions having good reliability wherein, when soldering the printed circuit board, any undesired solder is not only adhered to the surface-mount components or the connectors, which are mounted on the back surface thereof, but the solder also completely enters into through-holes.

Further, in a patent document 2, a flow soldering apparatus is disclosed. According to this flow soldering apparatus, when spouting molten solder from jet nozzles to locally solder electronic components on printed circuit board, a dummy jet nozzle and means for detecting a surface of liquid are provided therein. The dummy jet nozzle is positioned at a position which is near the jet nozzles and off the printed circuit board carried to a position to be soldered and positioned thereto. The means for detecting a surface of liquid is configured so that it detects a height of the molten solder spouted from the dummy jet nozzle. If the flow soldering apparatus is configured so as to do so, it is possible for the means for detecting a surface of liquid to detect the height of the molten solder spouted from the dummy jet nozzle, thereby enabling the height of the molten solder thus spouted to be grasped even during performing the soldering and allowing for dealing with any variations in the height of the molten solder thus spouted on a real-time basis.

Additionally, in relation to a jet pump that sends molten solder, in a patent document 3, a solder bath pump is disclosed. According to this solder bath pump, a screw is positioned in an interior space through which a casing is passed so that it can be rotated. The screw is configured so that plural spiral blades project outwardly from a rotation shaft thereof with them being positioned at regular intervals on a circumferential direction thereof and all the spiral blades encircle around the rotation shaft on the basis of a direction of an axis of the shaft. If the pump is configured so as to do so, it is possible to send the solder efficiently, as compared with the conventional pump, because the solder can be sent out evenly from an entire bottom surface of the screw excluding an area just blow the rotation shaft.

Prior Art Documents
Patent Documents
Patent Document 1: Japanese Patent Application Publication No. 2002-368404;
Patent Document 2: Japanese Patent Application Publication No. 2000-200966; and
Patent Document 3: Japanese Patent Application Publication No. 2005-028446.

DISCLOSURE OF THE INVENTION

Problems to be Solved by the Invention

By the way, in the partial-jet-soldering device according to the conventional examples, there are following questions.
(i) In electronic components such as connectors to be installed in a printed circuit board, there have been many large-sized ones until now. However, in recent years, based on a requirement of miniaturization of electronic components, even in insert-type electronic components, small-sized ones have been gradually manufactured. Accordingly, it is also necessary that nozzles used in the partial-jet-soldering device disclosed in the patent document 1 are miniaturized so as to be fit for the components. If the nozzles are made too small, variation in pressure applied to the nozzles becomes large at a time when output of a pump varies or the like so that it is confirmed that the solder spouts from any of the nozzles.

(ii) In order to solve the problem (i), addressing method therefor is conceivable such that revolutions of the screw pump disclosed in the patent document 3 decrease to reduce the pressure of the molten solder when sending it. If, however, the revolutions of the pump decrease excessively, there is a problem such that balance situation in which the pressure by which the molten solder is sent to the plural nozzles and the pressure applied to all the nozzles are balanced is upset so that a height of the molten solder spouted from the nozzles is unstable and the molten solder spouted from the nozzles is easy to generate an up-and-down movement.

(iii) There is a problem such that if the output of the pump is adjusted in error even a little amount thereof, the molten solder is spouted from any of the nozzles or the molten solder enters into jack insert holes inside the connectors so that a bad contact based on this occurs, which runs into a situation that they cannot be used at all as the connectors, or the solder adheres to a surface of the printed circuit board so that leak occurs between the wires to happen any malfunction.

(iv) It is conceivable to make the dummy jet nozzle disclosed in the patent document 2 have an adjustment function for a spouted amount of the molten solder, however, there is a problem such that merely by introducing the dummy jet nozzle disclosed in the patent document 2 as it is without putting any thought thereinto, it is impossible to obtain a suitable dummy jet nozzle with an adjustment function for a spouted amount thereof.

By the way, the dummy jet nozzle disclosed in the patent document 2 has not been able to adjust a spouted amount of the molten solder by merely introducing a configuration of the dummy jet nozzle of the patent document 2 because it has not been disclosed to adjust the spouted amount of the molten solder using the dummy jet nozzle of the patent document 2 and even if it is conceivable to adjust the spouted amount of the molten solder using that, a solder-spouting area of an open portion thereof is narrower, compared with that of any other soldering nozzle.

Means for Solving the Problems

Inventors have found out that when the nozzles of the partial-jet-soldering bath have smaller sizes, the pressure by which the molten solder is sent and the pressure of the molten solder spouted from all the nozzles as jets are not in balance so that the pressure of the molten solder, which is spouted from the nozzles as jets, is made higher, and by newly providing a preliminary nozzle for lightening the pressure applied from a surface of the molten solder in addition to the jet nozzles provided corresponding to portions to be soldered in the printed circuit board, the pressure by which the molten solder is sent and the pressure of the molten solder spouted from all the nozzles as jets are in balance so that any up-and-down movement of the molten solder spouted from the nozzles is eliminated and thus, they have completed these inventions.

A partial-jet-soldering device according to this invention is a partial-jet-soldering device that applies molten solder partially onto a component-mounting member to solder an electronic component to the component-mounting member, the device comprising a solder bath that has a solder-sending path and contains the molten solder, a solder-supplying portion that supplies the molten solder contained in the solder bath under a predetermined pressure to the solder-sending path, a first jet nozzle that has a predetermined solder-spouting area and connects the solder-sending path to spout the molten solder supplied from the solder-supplying portion under the predetermined pressure so that the solder rises by its surface tension, and a second jet nozzle that has a solder-spouting area more than that of the first jet nozzle and connects the solder-sending path to spout the molten solder supplied from the solder-supplying portion under the predetermined pressure, characterized in that the solder bath is composed of a container having a predetermined volume and an interior thereof is partitioned into a first section, a second section and a third section, the solder-sending path is positioned so that it is continuously communicated to the first, second and third sections in the interior of the container, at least the first section being positioned adjacent to the second section and the third section and allocated to a jet-soldering working area, nozzle bases being respectively positioned on the solder-sending paths of the first and third sections, the first jet nozzle is positioned on the nozzle base of the jet-soldering working area in the first section that is continuously communicated to the solder-sending path, the solder-supplying portion is positioned in the second section that is continuously communicated to the solder-sending path, and the second jet nozzle is on the outside of the jet-soldering working area in the solder bath and is positioned on the nozzle base in the third section that is adjacent to the second section in which the solder-supplying portion is positioned.

In the partial-jet-soldering device, since the solder-supplying portion that supplies the molten solder under a predetermined pressure to the solder-sending path is provided, the same pressure is applied to all the jet nozzles like Pascal's principle, "When pressure is exerted anywhere in an incompressible fluid confined inside a set container, the pressure is exerted equally in all positions if they have the same depths from a surface of the fluid". In fact, since the pressure applied the nozzles by the pump from below is larger than gravity allied to the nozzles from upper, the jet solder spouts from the nozzles but if areas of the open portions of the spouting nozzles are equal to each other, a spouted height thereof in this moment is proportional to the pressure applied the nozzles from below. In other words, the larger the pressure by the pump is, the higher the spouted height from the nozzles becomes.

Here, if nozzles each having a small opening area, in order to solder small-sized electronic components, are used, the height of the solder spouted from the nozzles is made higher because the pressure applied to each nozzle is made larger. As a solution strategy thereof, if the revolutions of the screw pump disclosed in the patent document 3 decrease excessively, the balance situation in which the pressure by which the molten solder is sent to the plural nozzles and the pressure applied to all the nozzles are balanced is upset so that a balance of the height of the jet is easy to be upset, thereby resulting in that a surface of the printed circuit board was covered with the solder or any failure of insufficient solder occurred.

In this invention, by providing the second jet nozzle having a solder-spouting area more than that of the first jet nozzles of the solder-supplying portion, the pressure applied to each nozzle is escaped and lightened and by keeping the revolutions of the pump within a range of revolution of the pump from middle revolutions to high revolutions, which are easy to be controlled, it is possible to maintain a height of the molten solder stable even when using the first nozzle having a small opening area in order to solder small-sized electronic components.

By the partial-jet-soldering device according to this invention, when applying the molten solder partially onto a component-mounting member to solder an electronic component to the component-mounting member, the molten solder is contained in the solder bath. The solder-supplying portion supplies the molten solder contained in the solder bath under a predetermined pressure to the first and second jet nozzles. The first jet nozzle has a predetermined solder-spouting area and spouts the molten solder supplied from the solder-supplying portion under the predetermined pressure so that the molten solder rises by its surface tension. The second jet nozzle has a solder-spouting area more than that of the first jet nozzle and spouts the molten solder supplied from the solder-supplying portion under the predetermined pressure so that the molten solder rises by its surface tension. On assumption of this, it is configured that the second jet nozzle is positioned on a position which is nearer the solder-supplying portion than the first jet nozzle.

Therefore, since the second jet nozzle having a solder-spouting area more than that of the first jet nozzle can absorb any variations in pressure of the molten solder, which the solder-supplying portion applies to the first jet nozzle, it is possible to function the second jet nozzle as the preliminary jet nozzle (dummy nozzle) for adjusting the spouted amount of the solder.

Thus, it is possible to provide the partial-jet-soldering device which can spout the molten solder partially onto the component-mounting member in a stable state without decreasing the revolutions of the screw pump or the like, which is difficult to set a spouted amount of solder, even if a jet nozzle having a solder-spouting area that is very smaller than that of the second jet nozzle accompanying with a miniaturization of electronic components.

A partial-jet-soldering method according to this invention is a partial-jet-soldering method in which the solder bath having three sections, at least a first section being positioned adjacent to a second section and a third section, is allocated to a jet-soldering working area, a first jet nozzle having a predetermined solder-spouting area is positioned on a nozzle base of the first section that is continuously communicated to a solder-sending path in the solder bath, a solder-supplying portion is positioned in the second section that is continuously communicated to the solder-sending path, a second jet nozzle is positioned on a nozzle base in the third section that is adjacent to the second section in which the solder-supplying portion is positioned, and molten solder is partially allied onto a component-mounting member to solder an electronic component to the component-mounting member, characterized in that the method comprises a step of supplying the molten solder contained in the solder bath under a predetermined pressure from the solder-supplying portion to the solder-sending path, and on the one side, a step of raising the molten solder supplied from the solder-supplying portion via the solder-sending path under a predetermined pressure by its surface tension in the first jet nozzle and applying the molten solder onto a portion in which an electronic component is soldered to the component-mounting member, and on the other side, a step of supplying the molten solder from the solder-supplying portion via the solder-sending path under the predetermined pressure to the second jet nozzle that is on the outside of the jet-soldering working area, for the first jet nozzle positioned on the nozzle base of the first section, on the solder bath and is positioned on the nozzle base in the third section that is adjacent to the second section and has a solder-spouting area more than that of the first jet nozzle, raising the molten solder by its surface tension with the second jet nozzle and adjusting a spouted amount of the molten solder supplied to the first jet nozzle.

EFFECTS OF THE INVENTION

By the partial-jet-soldering device and the partial-jet-soldering method according to the present invention, the first jet nozzle is positioned on the nozzle base of the first section that is continuously communicated to the solder-sending path in the solder bath having three sections, has a predetermined solder-spouting area and spouts the molten solder supplied from the solder-supplying portion under the predetermined pressure so that the solder rises by its surface tension, the solder-supplying portion is positioned in the second section that is continuously communicated to the solder-sending path, and a second jet nozzle that has a solder-spouting area more than that of the first jet nozzle and spouts the molten solder supplied from the solder-supplying portion under the predetermined pressure is on the outside of the jet-soldering working area in the solder bath and is positioned on a nozzle base in the third section that is adjacent to the second section in which the solder-supplying portion is positioned.

Based on such a configuration, since the second jet nozzle having a solder-spouting area more than that of the first jet nozzle can absorb any variations in pressure of the molten solder, which the solder-supplying portion applies to the first jet nozzle, it is possible to function the second jet nozzle as the preliminary jet nozzle (dummy nozzle) for adjusting the spouted amount of the solder. Furthermore, the second jet nozzle positioned in the third section that is on the outside of the surface to be soldered of the soldering group, which is provided in the printed circuit board, and does not hinder a partial-jet-soldering process enables a spouted amount of the molten solder from the first nozzle to be adjusted with a good reproducibility good.

Thus, it is possible to provide the partial-jet-soldering device which can spout the molten solder partially onto the component-mounting member in a stable state without decreasing the revolutions of the screw pump or the like, which is difficult to set a spouted amount of solder, even if a jet nozzle having a solder-spouting area that is very smaller than that of the second jet nozzle accompanying with a miniaturization of electronic components.

BEST MODE FOR CARRYING OUT THE INVENTION

This invention has an object to provide a partial-jet-soldering device and a partial-jet-soldering method, which can spout the molten solder partially onto component-mounting members in a stable state without decreasing the revolutions of a pump which is difficult to set a spouted amount of molten solder, even if a nozzle having a small spouting opening is used in a partial-jet-solder bath.

The second jet nozzle according to this invention may be positioned on a nozzle plate together with a first jet nozzles but positioning it on the outside of the nozzle plate, for example, beside the pump, near the pump, enables partial-jet-solder bath which has a more compact configuration to be obtained.

Figure 1:
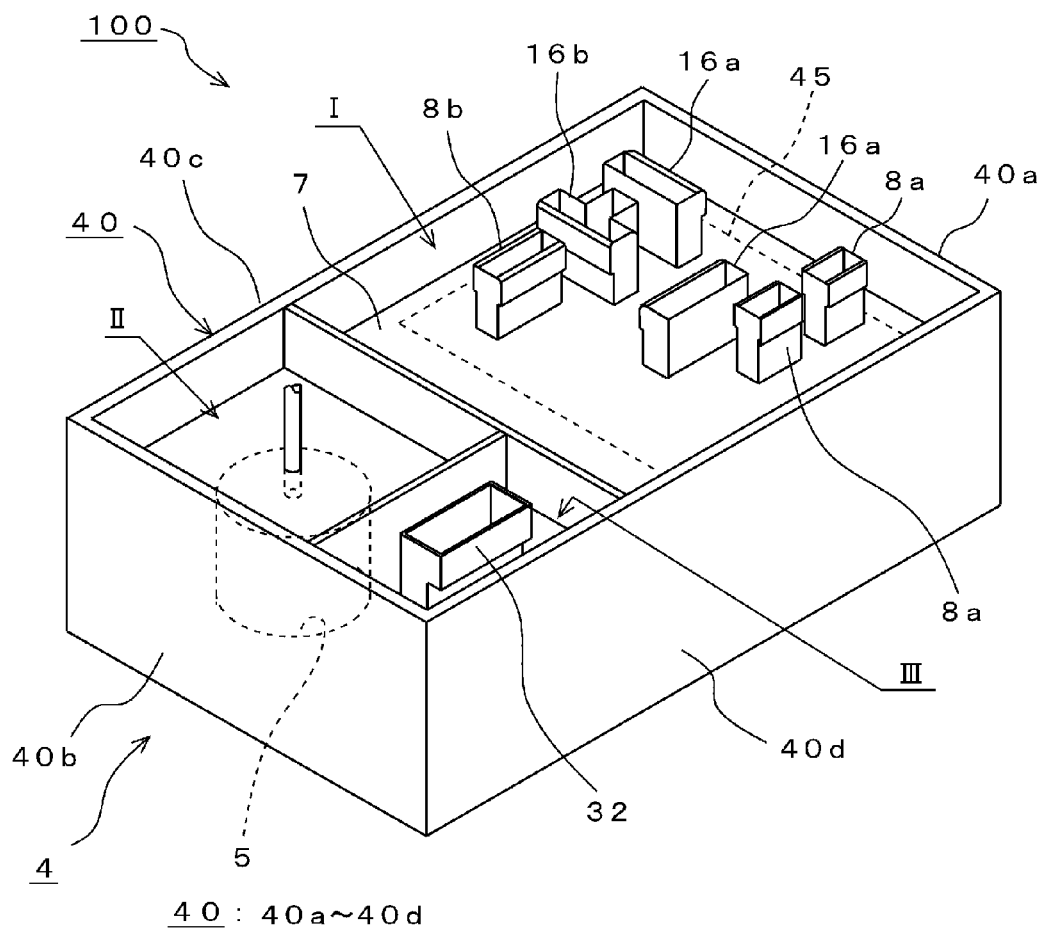
FIG. 1 is a perspective view of an automatic partial-jet-soldering apparatus 100 according to an embodiment of this invention for showing a configuration example thereof.

The following will describe the partial-jet-soldering device and the partial-jet-soldering method according to the present invention with reference to drawings. An automatic partial-jet-soldering apparatus 100 shown in FIG. 1 is an embodiment of a partial jet soldering apparatus according to the invention and applies molten solder 7 partially onto component-mounting members to solder electronic components to the component-mounting members. It is to be noted that thermal insulators are omitted in FIGS. 1 and 4.

The automatic partial-jet-soldering apparatus 100 is configured so as to have a solder bath 4 for partial jet, a jet pump of cylinder type (hereinafter, simply referred to as a "pump 5"), four kinds of jet nozzles for partial soldering (hereinafter, referred to as "nozzles 8a, 8b, 16a, 16b") and a dummy nozzle 32 for spouted amount adjusting.

Figure 3:
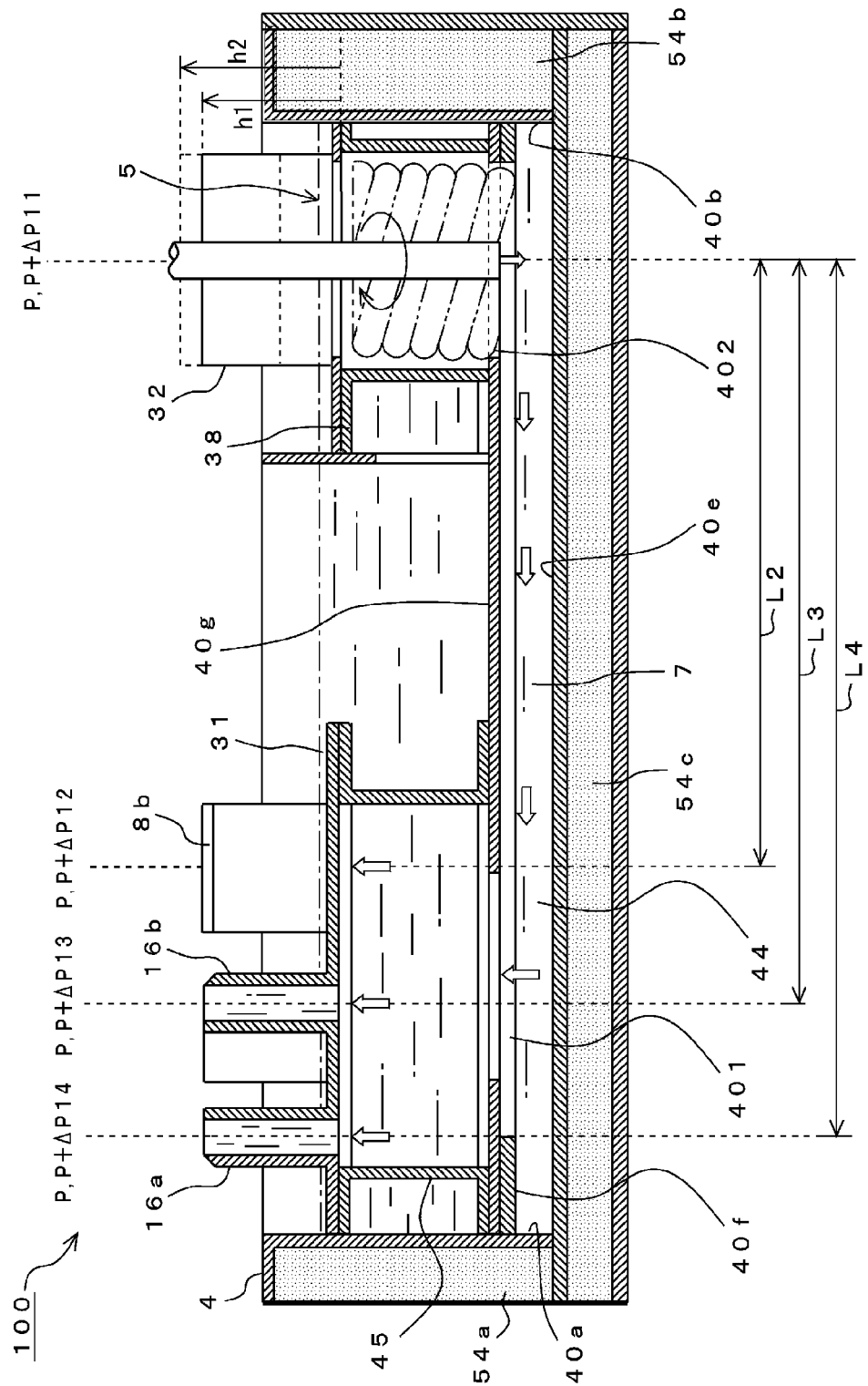
FIG. 3 is a sectional view of the automatic partial-jet-soldering apparatus 100, shown in FIG. 2, for showing a functional example (part one thereof) of the dummy nozzle 32, taken along arrow lines X1-X1.
Figure 4:
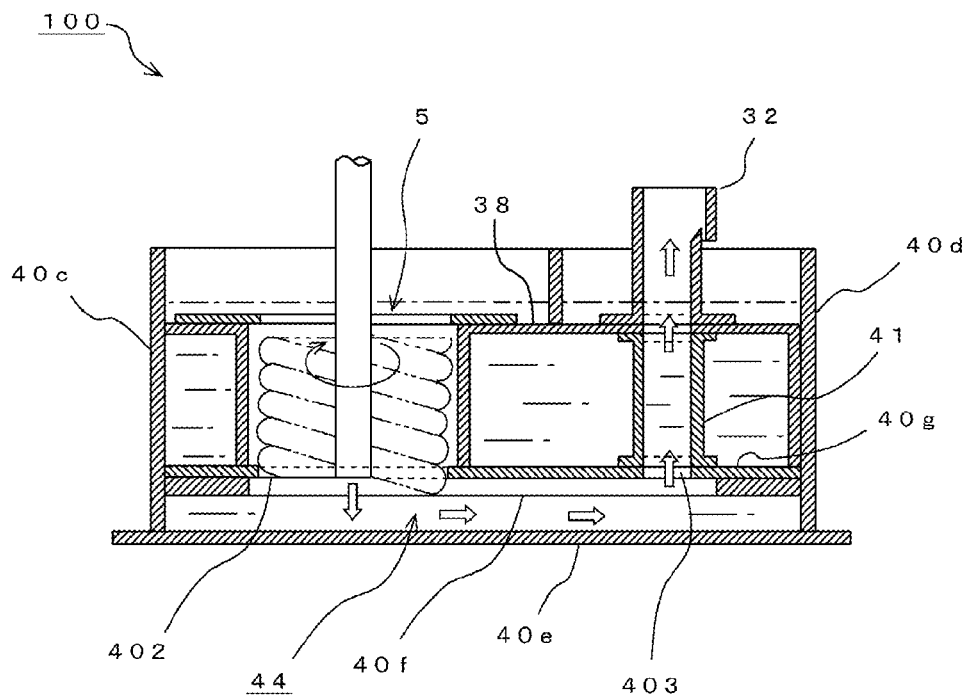
FIG. 4 is a sectional view of the automatic partial-jet-soldering apparatus 100, shown in FIG. 2, for showing a functional example (part two thereof) of the dummy nozzle 32, taken along arrow lines Y1-Y1.

The solder bath 4 is composed of a metal container 40 having a predetermined volume (capacity) and an interior thereof is partitioned into three sections I, II and III, the largest section I of which is allocated to a jet-soldering working area. In the sections I, II and III, a nozzle base portion 44 constituting an example of a solder-sending path as shown in FIG. 3 is provided. In FIGS. 3 and 4, solid white arrows show a flown direction of the molten solder.

The container 40 is composed of side surface plates 40a, 40b, side surface plates 40c, 40d (see FIG. 4), which constitute an inner wall surrounded on four sides, and a bottom surface plate 40e supporting the side surface plates 40a through 40d. A portion that reaches a predetermined height from the bottom surface plate 40e, to the side surface plate 40a, a frame member 40f for supporting the base plate is joined. on the frame member 40f, a base plate 40g for mounting member is provided.

In this example, the nozzle base portion 44 is composed of the bottom surface plate 40e, the base plate 40g and the side surface plates 40a through 40d on a side of frame member 40f and constitutes a solder-extruding path (main duct). In this example, no baffle plate is installed in the solder-extruding path. The baffle plate is made of a perforated plate or a net so that it has a defect such that an oxide is easy to block the opening thereof. Thus, in the partial-jet-soldering device according to the invention in which the molten solder is supplied to the solder-extruding path under a predetermined pressure, jet is stable so that it is preferable to avoid installing the baffle plate. In the base plate 40g, three openings 401 through 403 are formed. In the base plate 40g, the opening 401 is open at a part thereof reaching the section I, the opening 402 is open at a part thereof reaching the section II, and the opening 403 is open at a part thereof reaching the section III, respectively.

The solder bath 4 contains the molten solder 7, and around the container 40, thermal insulators 54a, 54b are provided. At the bottom thereof, a thermal insulator 54c is provided. A heating device, not shown, is embedded in each of these thermal insulators 54a through 54c and the like and by the heating device, they are heated to a desired temperature. The solder bath 4 is made by forming, for example, a stainless plate (SUS304) as a box.

The opening 402 of the nozzle base portion 44 is continuously communicated to the section II. In the section II, the pump 5 is provided to connect the nozzle base portion 44. The pump 5 supplies the molten solder 7 contained in the solder bath 4 under a predetermined pressure into the nozzle base portion 44. The pump 5 is controlled so as to adjust a flown amount of the molten solder 7 spouted from the nozzles 8a, 8b, 16a and 16b. For the pump 5, a pump of cylinder type in which a baffle plate is not used is used. For the pump of cylinder type, a screw pump (impeller pump) of completely hermetical type.

A nozzle base 45 with a rectangular flange shape is mounted on the top of the nozzle base portion 44 and on the nozzle base 45, a nozzle plate 31 is mounted. The nozzles 8a, 8b and the nozzles 16a, 16b and the like are drawn from (connected to) the nozzle plate 31. In this example, a total of six pieces of two nozzles 8a, one nozzle 8b, two nozzles 16a and one nozzle 16b is connected to the nozzle base portion 44 via the nozzle base 45 constituting the solder-supplying path.

Each of the nozzles 8a is configured so that its opening portion from which the molten solder 7 is spouted has rectangular shape and a solder-spouting area thereof is S1. The nozzle 8b is also configured so that its opening portion has rectangular shape and a solder-spouting area thereof is S2 (S2>S1). Each of the nozzles 16a is also configured so that its opening portion has rectangular shape and a solder-spouting area thereof is S3. The nozzle 16b is configured so that its opening portion has convex shape and a solder-spouting area thereof is S4 (S4>S3). Magnitude of the solder-spouting areas of the four kinds of nozzles 8a, 8b, 16a and 16b is set so as to be S4>S3>S2>S1.

Two rectangular shaped nozzles 8a, 8a are connected to the nozzle plate 31 side by side at positions which are near the right end of the plate 31 in the drawing and spout the molten solder 7 supplied from the pump 5 under the predetermined pressure so that it rises by its surface tension. Two nozzles 16a, 16a having the same shape are connected so that they are arranged like an L-shape at positions which are near the middle and the right end of the nozzle plate 31 and spout the molten solder 7 supplied from the pump 5 under the predetermined pressure so that it rises by its surface tension.

One nozzle 16b having the convex shape is positioned at a position surrounded by the nozzle 8b and the nozzles 16a, 16a and spouts the molten solder 7 supplied from the pump 5 under the predetermined pressure so that it rises by its surface tension. One nozzle 8b having the rectangular shape is positioned at a position near the dummy nozzle 32 and arranged side by side with the above-mentioned nozzles 16a, 16b and spouts the molten solder 7 supplied from the pump 5 under the predetermined pressure so that it rises by its surface tension.

Each of the six nozzles 8a, 8a, 8b, 16a, 16a and 16b has almost the same shape as a shape of a surface to be soldered of a soldering group 3, which is provided in a printed circuit board for a surface-mount component (hereinafter, simple referred to as "printed circuit board 1) as shown in, for example, FIG. 8. This enables the molten solder 7 to be spouted to the surface to be soldered of the soldering group 3, which is provided in the printed circuit board 1 with a good reproducibility (local soldering process)

The dummy nozzle 32 has a solder-spouting area S5 that is larger than that of any of the nozzles 8a, 8a, 8b, 16a, 16a and 16b, is connected to a nozzle plate 38 mounted via a nozzle base 41 on the top of the nozzle base portion 44 as shown in FIG. 4 and spouts the molten solder 7 supplied from the pump 5 under the predetermined pressure. The dummy nozzle 32 is positioned on a position which is nearer the pump 5 than any of the six nozzles 8a, 8a, 8b, 16a, 16a and 16b. For example, it is positioned on the section III that is adjacent to the section II in the drawing. It is preferable that the section III in which the dummy nozzle 32 is positioned is not in contact with an outside of the surface to be soldered of the soldering groups 3, which is provided in the printed circuit board 1. In this example, the dummy nozzle 32 was positioned in the section III of the solder bath 4, which is on the outside of the section I for a jet-soldering working area and does not hinder a partial-jet-soldering process. The dummy nozzle 32 thus configured enables a spouted amount of the molten solder 7 from the nozzles 8a, 8a, 8b, 16a, 16a and 16b to be adjusted with a good reproducibility on the outside of the surface to be soldered of the soldering group 3, which is provided in the printed circuit board 1.

Figure 2:
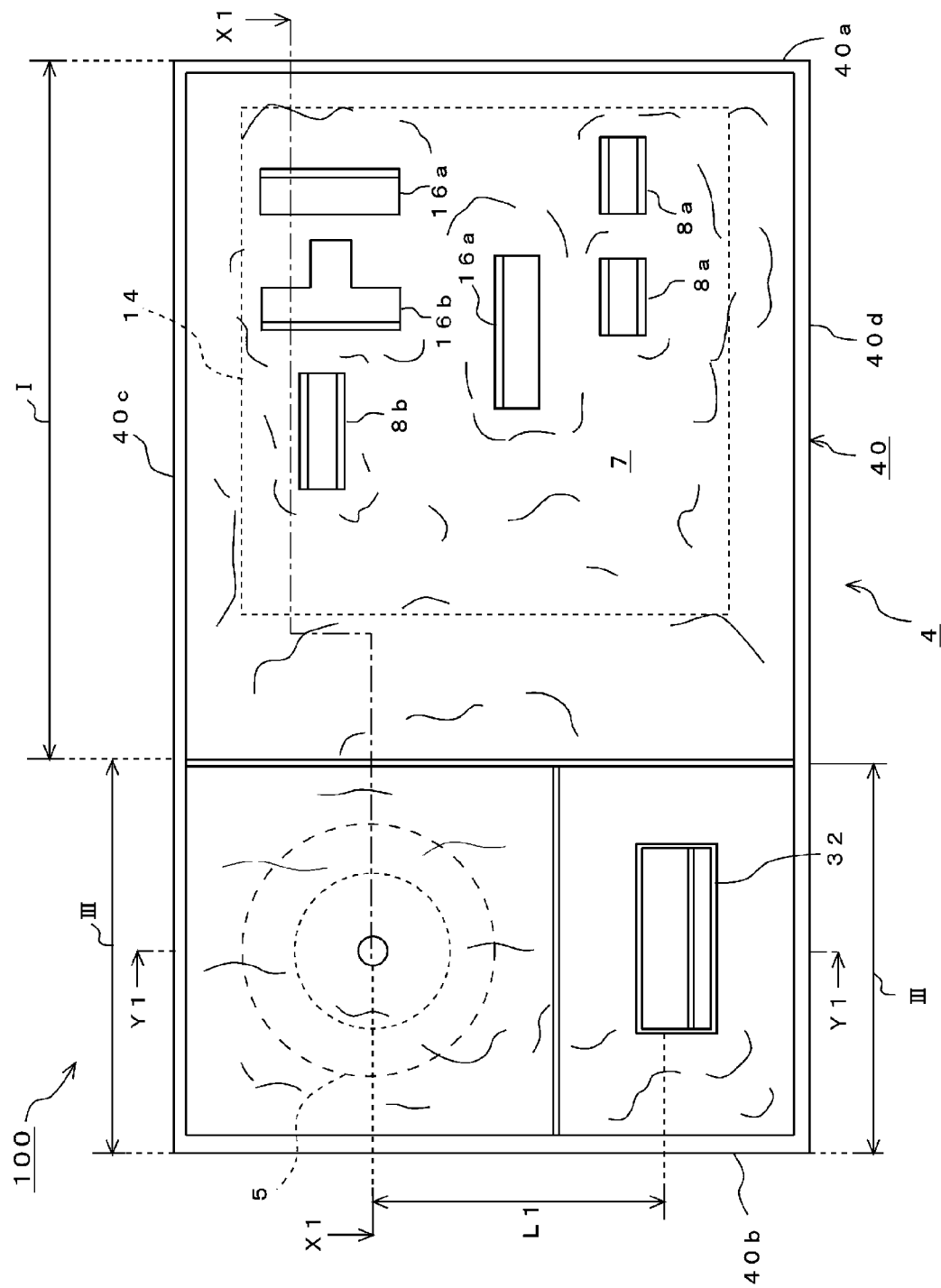
FIG. 2 is a top plan view of the automatic partial-jet-soldering apparatus 100 for showing an arranged example of a dummy nozzle 32 therein.

Next, the following will describe an operation example of the dummy nozzle 32 in the automatic partial-jet-soldering apparatus 100 with reference to FIGS. 2 through 4. The nozzle plate 31 is provided at a predetermined position on the nozzle base 45 of the automatic partial-jet-soldering apparatus 100 as shown in FIG. 3 and on the nozzle plate 31, the six nozzles 8a, 8a (not shown), 8b, 16a, 16a and 16b are positioned.

On the nozzle base 41, on the top of the nozzle base portion 44, adjacent to the pump 5 other than the nozzle plate 31, the dummy nozzle 32 as shown in FIG. 4 is positioned. The dummy nozzle 32 is mounted on the nozzle plate 38 in the section III shown in FIG. 3 and is positioned in an exposed state so that the molten solder 7 of its opening portion is exposed to the air.

This enables the dummy nozzle to receive any variations in the revolutions of the pump 5 at the position that is away from the nozzle plate 31 and is adjacent to the pump 5, thereby allowing variations in the height of spouted molten solder 7 to be absorbed with a good reproducibility before pressure has been propagated to any of the nozzles 8a, 8b, 16a and 16b. In this example, a height of the dummy nozzle 32 is set to h1, on the basis of an upper surface of the nozzle base 41, which is set so as to be the same height of the nozzles 8a, 8b, 16a and 16b. Of course, the height of the dummy nozzle 32 may be set to h2 as shown in dashed lines in the drawing so that h2 is higher than h1, the height of the nozzles 8a, 8b, 16a and 16b, (h2>h1).

Here, a distance from an axis part of the pump 5 to the dummy nozzle 32 is set to L1 as shown in FIG. 2. A distance from the same axis part to the nozzle 8b is set to L2 as shown in FIG. 3. A distance from the same axis part to the nozzle 16b is set to L3. A distance from the same axis part to the nozzle 16a is set to L4. The distances from the axis part of the pump 5 to the three nozzles 8b, 16a and 16b and the dummy nozzle 32 are set so as to be L4>L3>L2>L1. This means that a period of propagation time when pressure P is propagated from the axis part of the pump 5 to the three nozzles 8b, 16a and 16b and the dummy nozzle 32 is delayed successively.

On a stationary state, if pressure when the molten solder 7 supplied from the pump 5 to the nozzle base portion 44 is pressurized is P, the molten solder 7 is supplied to the opening portion of each of the three nozzles 8b, 16a, 16b and one dummy nozzle 32 under the pressure P uniformly. The molten solder 7 is supplied to the opening portion of each of the three nozzles 8a, 8b, 16a, not shown in FIG.3, under the pressure P uniformly (Pascal's principle).

Pascal's principle is referred to as a principle such that when the pressure P is exerted a surface of the molten solder of a set container 40 of the solder bath 4 or the like, which is filled with the molten solder, which is an incompressible fluid, the pressure is exerted equally in all positions unless it is subject to the influence by gravity, in other words, if they have the same depths from a surface of the surface of the molten solder.

On the time of output variation when the pressure P of the molten solder 7 is increased by $\Delta P$ from the stationary state in which the molten solder 7 is supplied from the pump 5 to the nozzle base portion 44 under the set pressure P, the molten solder 7 is supplied to the dummy nozzle 32 under the pressure P+ $\Delta P11$. The molten solder 7 is supplied to the nozzle 8b under the pressure P+ $\Delta P12$. The molten solder 7 is supplied to the nozzle 16b under the pressure P+ $\Delta P13$. The molten solder 7 is supplied to the nozzle 16a under the pressure P+ $\Delta P14$.

In this example, the distances from the axis part of the pump 5 to three nozzles 8b, 16a and 16b and one dummy nozzle 32 are set so as to be L4>L3>L2>L1. Therefore, among the pressure variation $\Delta P11$ in the dummy nozzle 32, the pressure variation $\Delta P12$ in the nozzle 8b, the pressure variation $\Delta P13$ in the nozzle 16b and the pressure variation $\Delta P14$ in the nozzle 16a, there is a relationship so that a period of propagation time when the pressure variation $\Delta P$ is propagated from the axis part of the pump 5 to one dummy nozzle 32 and three nozzles 8b, 16a and 16b is delayed successively.

Based on this, respective variations have a relationship of $\Delta P11 > \Delta P12 > \Delta P13 > \Delta P14$. Namely, the dummy nozzle 32 having solder-spouting area S5 that is larger than that of any of the six nozzles 8a, 8a, 8b, 16a, 16a and 16b can absorb almost the variation $\Delta P \approx \Delta P11$ accompanying with an increase of the output of the pump 5.

Figure 5:
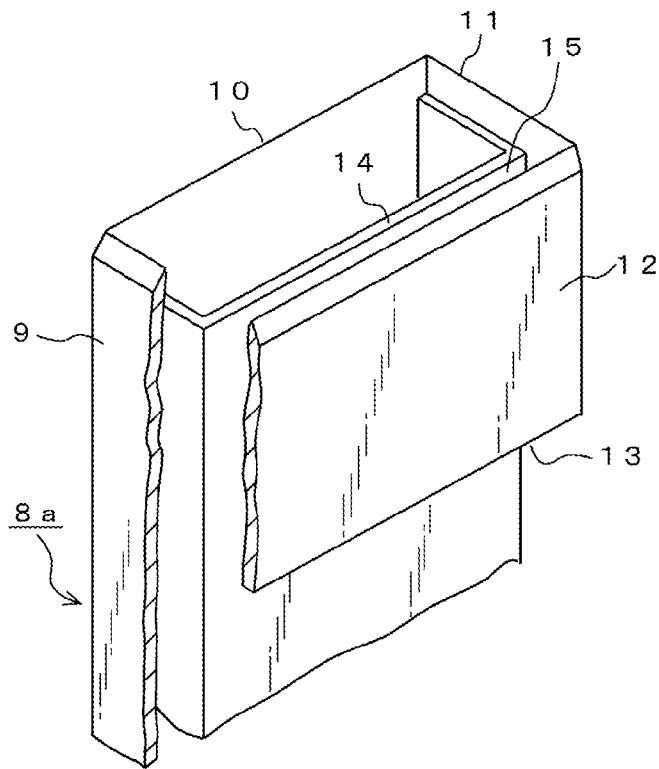
FIG. 5 is a perspective view of a nozzle 8a to be mounted on the automatic partial-jet-soldering apparatus for showing a configuration example thereof.

The following will describe configuration examples of the nozzles 8a, 8b and the like mounted on the automatic partial-jet-soldering apparatus with reference to FIG. 5. The nozzle 8a shown in FIG. 5 is configured so as to have almost the same shape as that of the soldering group 3 in the printed circuit board 1 as shown in FIG. 8. The nozzle 8a has a rectangular shape, is formed by four wall surfaces 9, 10, 11 and 12, three wall surfaces 9, 10 and 11 of which are immersed in the molten solder, and is continuously communicated to the pump 5 via the nozzle base portion 44 in the molten solder 7.

The wall surface 12 is cleared away on the way and a lower part of the cleared-away portion forms a drain portion 13 of the molten solder 7. A branch duct 14 is positioned in the nozzle 8a. The branch duct 14 in the nozzle 8a, an upper end of which is lower slightly than an upper end of the nozzle 8a, is continuously communicated to the pump 5 via the nozzle base portion 44 under a liquid surface of the molten solder 7. A space 15 is provided between the branch duct 14 and the wall surface 12 having the drain portion 13. An end of the branch duct 14, as shown in FIG. 5, has a U-shape and both sides of the U-shaped part adhere closely to the short wall surfaces of the nozzle 8a. Concerning the nozzle 8b, a width thereof on its lateral direction is the same as that of the nozzle 8a but only a length thereof on its longitudinal direction is different therefrom and other configuration is identical. Therefore, see the configuration of the nozzle 8a.

It is not limited to this: anything in which both sides of the ends of a branch duct 21 having a rectangular frame shape adhere closely to the short wall surfaces of the nozzle 16a may be used. For example, according to the nozzle 16a shown in FIG. 6, it is a nozzle that can be mounted on the automatic partial-jet-soldering apparatus 100 and is formed by four wall surfaces 17, 18, 19 and 20 which forma rectangular shape around the branch duct 14. In these wall surfaces, every low portion thereof is cleared away on the way so that lower parts of the longitudinal wall surfaces 18, 20 opposed to each other forms drain portions 13, 13. The branch duct 21 which is continuously communicated with the pump 5 is positioned in the nozzle 16a. The branch duct 21 is configured so that an upper end thereof is lower slightly than an upper end of the nozzle 16a and spaces 15, 15 are provided between it and each of the wall surfaces 18, 20 having the drain portions 13, 13.

Figure 6:
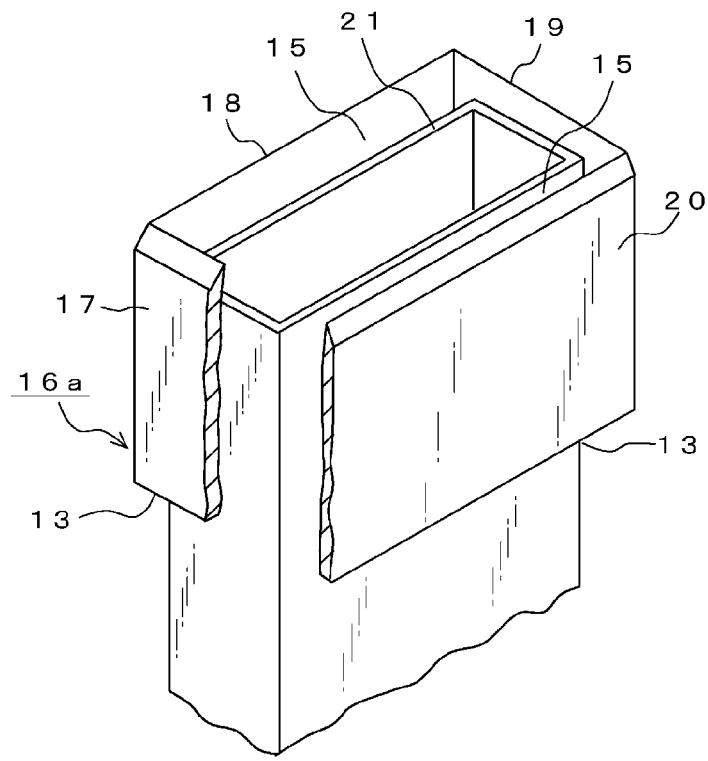
FIG. 6 is a perspective view of a nozzle 16a to be mounted on the automatic partial-jet-soldering apparatus for showing a configuration example thereof.

In the nozzles 8a, 8b, 16a and 16b shown in FIGS. 5 and 6, their upper ends are processed so as to have shapes like knife edges. These shapes like knife edges are applied thereto because by forming upper ends of these nozzles as slant parts, the molten solder 7 does not remain at the upper ends thereof. In other words, in the solder bath 4, the molten solder 7 is not always in the spouted state but the molten solder 7 is introduced into the nozzles 8a, 8b, 16a and 16b and spouted therefrom only when adhering the molten solder 7 onto the printed circuit board 1 as shown in FIG. 8. Thus, on the non-spouting time, the molten solder 7 stays at lower positions in the nozzles 8a, 8b, 16a and 16b so that the nozzles 8a, 8b, 16a and 16b become cool state thereof. Then, on the spouting time, when introducing the molten solder 7 into the nozzles 8a, 8b, 16a and 16b and spouting it, the cooled nozzles 8a, 8b, 16a and 16b lower the temperature of the spouted molten solder 7.

Accordingly, an "idling spouting" that has spouted the molten solder 7 from the nozzles 8a, 8b, 16a and 16b before the molten solder 7 is adhered onto the printed circuit board 1 is performed. In this idling spouting, the nozzles 8a, 8b, 16a and 16b are heated and cleaning any oxides adhered into the nozzles 8a, 8b, 16a and 16b is also performed. When performing the idling spouting, if the upper ends of the nozzles are even, any solder remains in the upper ends of the nozzles, which may be linked with any adhesion to undesired portions of the printed circuit board 1. Thus, forming the upper ends of the nozzles as shapes like knife edges having the slants enables the molten solder 7 to be not remained.

In this example, of the solder bath 4, the nozzles 8a, 8b, 16a and 16b may be made of materials which have good heat conductivity so that the temperatures of the nozzles 8a, 8b, 16a and 16b can rise soon when performing the idling spouting. As materials which have good heat conductivity, copper is cited but if copper is used in the nozzles 8a, 8b, 16a and 16b as it is, the molten solder 7 is metallically bonded to the copper so that the copper is merged into the molten solder 7 after a long time has been elapsed. This is called as solder erosion. Accordingly, stainless, particularly, SUS316, which has good heat conductivity and less erosion of the molten solder 7, is suitable for the nozzles 8a, 8b, 16a and 16b. Further, if nitriding is performed on the stainless, it is capable of reducing the erosion more efficiently.

The nozzles 8a, 8b, 16a and 16b used in the solder bath 4 according to the invention are configured so that the drain portion(s) 13 of the molten solder 7, which is (are) formed at lower portions of the nozzles, is (are) one or more. In a case of the nozzles 8a, 8b, one space 15 is provided between the branch duct 14 positioned in each of the nozzles 8a, 8b and the wall surface of the nozzle so that the drain portion 13 is formed by opening the lower portion of the wall surface of the nozzle. In a case of the nozzles 16a, 16b, two spaces 15, 15 are provided between the branch duct 21 positioned in each of the nozzles 16a, 16b and the wall surfaces of the nozzle so that the drain portions 13 are formed by opening the lower portions of the wall surfaces of the nozzle.

The space(s) 15, 15 is (are) provided between the branch duct 14, 21 or the like and the wall surface of the nozzle at one portion of the one wall surface of any of the nozzles 8a, 8b as shown in FIG. 5 or at two portions of the two wall surfaces opposed to each other as shown in FIG. 6 so that the drain portion(s) 13 are formed at the lower portion(s) of the wall surface(s) thereof. The drain portion(s) 13 may be positioned upper or lower than the liquid surface of the molten solder 7.

Figure 8:
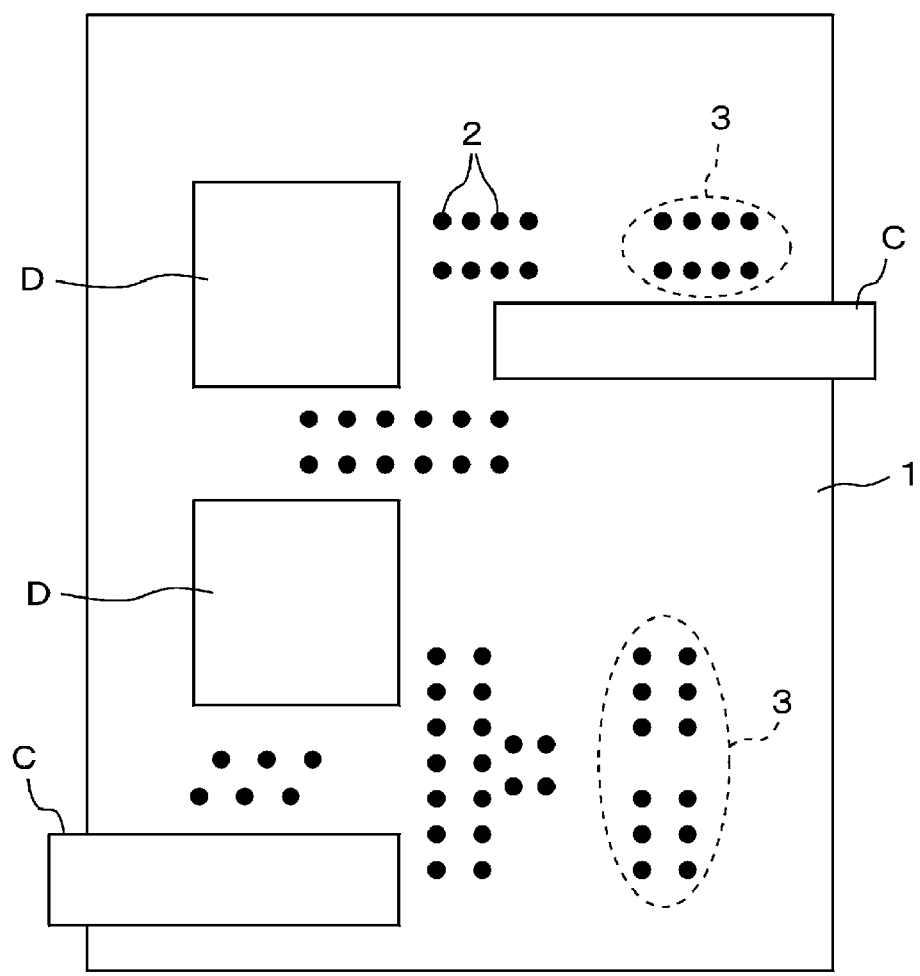
FIG. 8 is a top plan view of a printed circuit board 1 for showing a configuration example thereof.

Shapes of the nozzles 8a, 8b, 16a and 16b are fit for those of the soldering groups 3 in the printed circuit board 1 as shown in FIG. 8 and may contain various kinds of shapes such as an L-shape, a convex shape or a crosswise shape, in addition to the rectangular shape. In the nozzle 16b having such shapes other than the rectangular shape, the drain portions 13 of two or more may be formed. The drain portions 13 of two or more are formed so that a flown direction of the molten solder 7 may be suitably selected. Such a suitable selection of the flown-out direction still effectively prevents a bridge.

Figure 7:
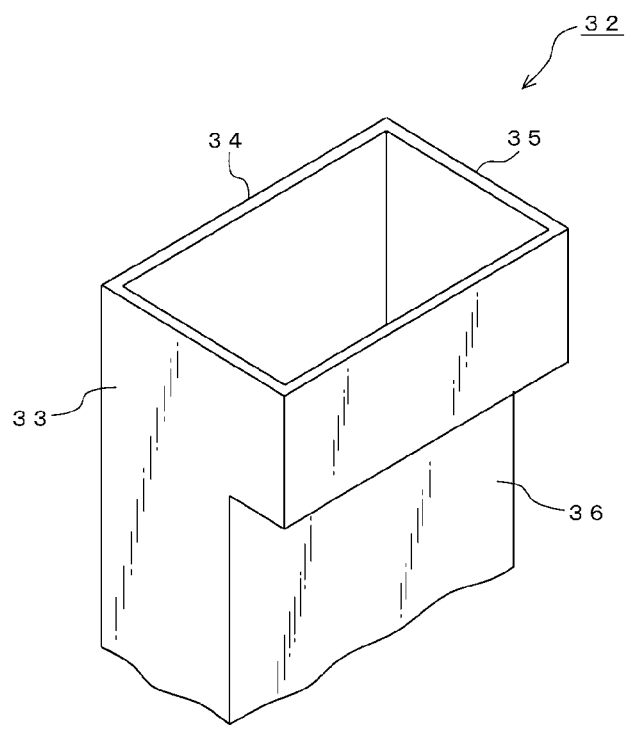
FIG. 7 is a perspective view of the dummy nozzle 32 for showing a configuration example thereof.

The following will describe a configuration example of the dummy nozzle 32 with reference to FIG. 7. The dummy nozzle 32 shown in FIG. 7 maybe mounted on the automatic partial-jet-soldering apparatus 100. The dummy nozzle 32 has a shape which has no relation to that of the surface to be soldered of the soldering group 3 in the printed circuit board 1, which is different from the nozzles 8a, 8b, 16a and 16b.

In this example, the dummy nozzle 32 has a rectangular shape seen from above but an inverse L-shape seen from side. The dummy nozzle 32 is composed of four wall surfaces 33, 34, 35 and 36, four wall surfaces 33, 34, 35 and 36 of which are connected with the nozzle plate 38, and is formed of a part thereof which is immersed in the molten solder 7 and apart thereof which is exposed from the liquid surface of the molten solder 7. The dummy nozzle 32 is continuously communicated to the pump 5 via the nozzle base 41, the opening 403 and the nozzle base portion 44 in the molten solder 7. The dummy nozzle 32 has a rectangular frame shape which extends from the nozzle plate 38. An opening portion thereof is exposed to air. It has an upper opened shape in which no knife edge like the nozzles 8a, 8b, 16a and 16b is provided. A space, not shown, is provided in the inverse L-shape portion thereof.

In this example, the dummy nozzle 32 may use stainless (SUS316 or the like), which has good heat conductivity and less solder erosion, like the nozzles 8a, 8b, 16a and 16b. Further, if nitriding is performed on the stainless, it is capable of reducing the solder erosion more efficiently. A shape of the opening of the dummy nozzle 32 is not required to fit that of the soldering group 3 in the printed circuit board 1 like the nozzles 8a, 8b, 16a and 16b.

In this example, the shape of the opening of the dummy nozzle 32 may contain various kinds of shapes such as an L-shape, a circular shape or a crosswise shape, in addition to the rectangular shape. The dummy nozzle 32 may have any shape if such a shape is easy to receive any variations in pressure of the pump 5 and can absorb any variations in pressure of the molten solder 7 with good reproducibility before the variations in pressure are propagated to the nozzles 8a, 8b, 16a and 16b.

The dummy nozzle 32 for adjusting a spouted amount of solder (for absorbing surge), which is positioned in the solder bath 4 according to the invention, has a solder-spouting area S5 which is larger than any of the solder-spouting areas S1 through S4 of the nozzles 8a, 8b, 16a and 16b. Therefore, even if a small-sized jet nozzle is used for the nozzles 8a, 8b, 16a and 16b or the like, it is easy to attain the balance between the pressure P by which the molten solder 7 is sent and the pressure P by which it is spouted from all the nozzles 8a, 8b, 16a and 16b and the dummy nozzle 32 as jet, and the dummy nozzle 32 is easy to receive any variations in pressure of the pump 5 and can absorb any variations in pressure of the molten solder 7 with good reproducibility before the variations in pressure are propagated to the nozzles 8a, 8b, 16a and 16b.

Here, the printed circuit board 1 which is subject to the partial-jet-soldering will be described with reference to FIG. 8. The printed circuit board 1 shown in FIG. 8 constitutes an example of component-mounting member and the surfaces to be soldered are defined in the printed circuit board 1. In the drawing, the surface to be soldered is an area surrounding positions 2 to be soldered, which is illustrated by black dots. In the printed circuit board 1, the soldering group 3 is formed by collecting many positions 2 to be soldered, which are on a rear surface of the printed circuit board 1.

Thus, forming the soldering group 3 by many positions 2 to be soldered is because electronic components to be loaded on the printed circuit board 1 is configured so that many leads are provided in one electronic component like a pin grid array (PGA) or a dual package or electrodes leading to many jacks like connectors are installed thereto.

Further, a recent printed circuit board may load surface-mount components D, connectors C and the like, in order to increase mounting density, on the rear surface of the printed circuit board 1. Therefore, in the recent printed circuit board 1, there has been many cases in which the positions 2 to be soldered for the surface-mounting constitute the soldering group 3 and the surface-mount components D, connectors C and the like are loaded on the rear surface thereof.

Thus, shapes of the surface to be soldered of the soldering group 3 in the printed circuit board 1 and those of the nozzles 8a, 8b, 16a and 16b having the same shapes as them are respectively corresponded and arrangements of the soldering group 3 and arrangements of the nozzles 8a, 8b, 16a and 16b having the same shapes as them are respectively corresponded. For example, two soldering groups 3 between the upper surface-mount components D and the upper connector C in the printed circuit board 1 correspond to two nozzles 8a, 8b. Similarly, one soldering group 3 between the upper surface-mount components D and the lower surface-mount components D corresponds to one nozzle 16a.

Similarly, one soldering group 3 between the lower surface-mount components D and the lower connector C corresponds to one nozzle 8b. Similarly, one convex soldering group 3 adjacent to the lower surface-mount components D and the lower connector C corresponds to one nozzle 16b. Similarly, one soldering group 3 adjacent to it corresponds to one nozzle 16a.

Figure 9:
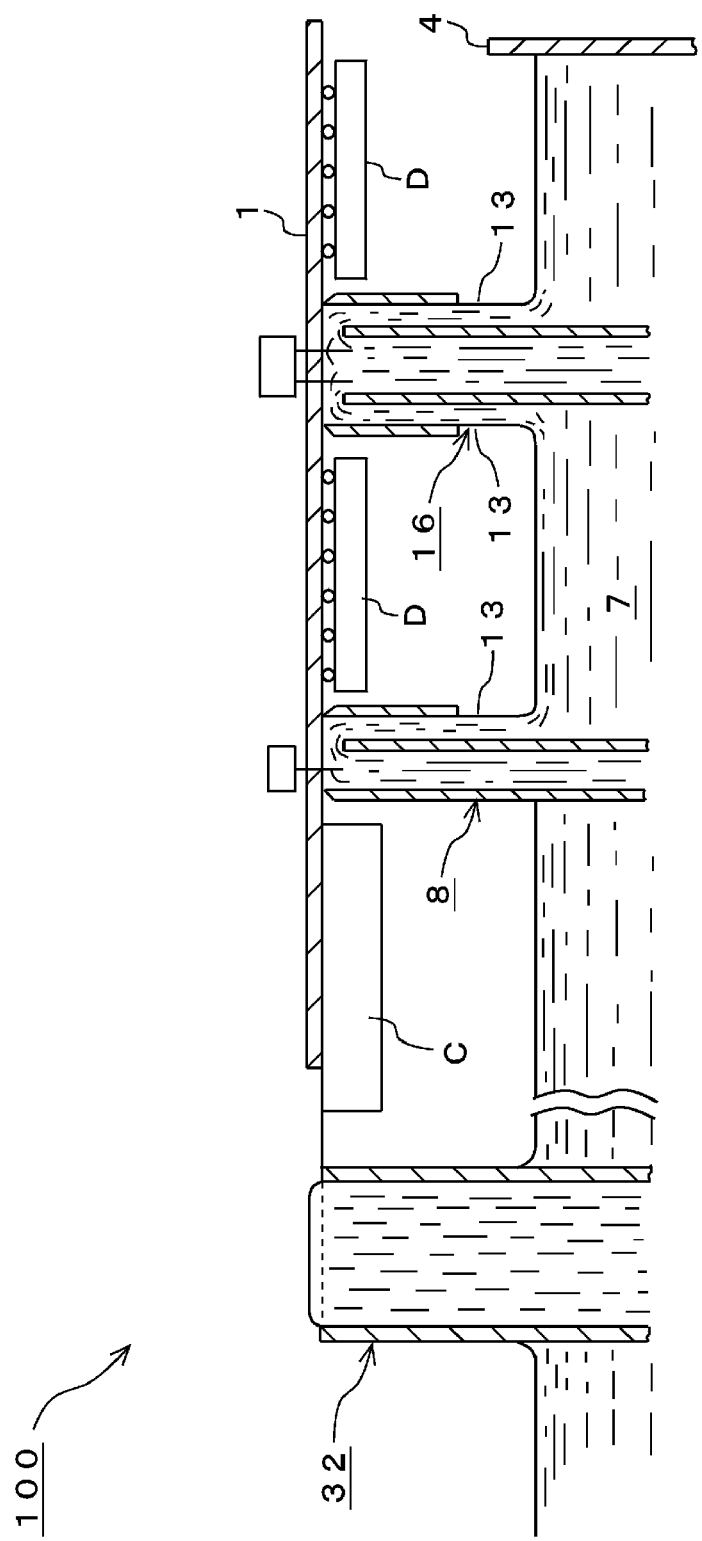
FIG. 9 is a sectional view of the automatic partial-jet-soldering apparatus for showing an operational example thereof.

The following will describe a partial-jet-soldering method to the printed circuit board 1 in the solder bath 4 in which the dummy nozzle 32 in addition to the nozzles 8a, 8b, 16a and 16b are provided with reference to FIG. 9. In this example, it is assumed that when applying the molten solder 7 partially onto the printed circuit board 1 to solder electronic components to the printed circuit board 1, the dummy nozzle 32 for adjusting a spouted amount of solder (for absorbing surge), which has a solder-spouting area S5 that is larger than any solder-spouting areas S1 through S4 of the nozzles 8a, 8b, 16a and 16b, is positioned at the section III that is nearer the pump 5 than the nozzles 8a, 8b, 16a and 16b. The nozzles 8a, 8b, 16a and 16b have almost the same shape and arrangement as the same shape and arrangement of the surface to be soldered of the soldering group 3 in the printed circuit board 1.

On these partial-jet-soldering conditions, first, the printed circuit board 1 is held by a carrying chuck, not shown; any flux is applied to the soldering group 3 shown in FIG. 3 by a fluxer, not shown; and it is preliminarily heated and arrives at the solder bath 4. In the solder bath 4, six nozzles 8a, 8a, 8b, 16a, 16a and 16b having almost the same shapes as those of the soldering groups 3 in the printed circuit board 1 are positioned at positions corresponding to the soldering groups 3. The printed circuit board 1 is carried up to above the nozzles 8a, 8a, 8b, 16a, 16a and 16b to which the respective soldering groups 3 correspond.

In this example, two nozzles 8a, 8a are aligned with two soldering groups 3 between the upper surface-mount component D and the upper connector C in the printed circuit board 1 shown in FIG. 8 so that they are opposed to each other. Similarly, one nozzle 16a is aligned with one soldering group 3 between the upper surface-mount component D and the lower surface-mount component D so that they are opposed to each other.

Similarly, one nozzle 8b is aligned with one soldering group 3 between the lower surface-mount component D and the lower connector C so that they are opposed to each other. Similarly, one nozzle 16b is aligned with one convex soldering group 3 adjacent to the lower surface-mount component D and the lower connector C so that they are opposed to each other. Similarly, one nozzle 16a is aligned with one soldering group 3 adjacent to it so that they are opposed to each other.

In this example, after they are aligned, before the printed circuit board 1 is soldered, the idling soldering has been performed to increase temperature of the nozzles and to clean the inner walls of the nozzles. This idling soldering heats the nozzles 8a, 8a, 8b, 16a, 16a and 16b and cleans any oxides adhered into the nozzles 8a, 8a, 8b, 16a, 16a and 16b.

After the idling soldering, the printed circuit board 1 is put on the nozzles 8a, 8a, 8b, 16a, 16a and 16b and then, it is still put on the nozzles 8a, 8a, 8b, 16a, 16a and 16b for some time. The printed circuit board 1 put on the nozzles 8a, 8a, 8b, 16a, 16a and 16b is heated by the molten solder 7 within the nozzles 8a, 8a, 8b, 16a, 16a and 16b to increase its temperature up to a temperature on which the soldering groups 3 are suitable for being soldered.

Then, the pump 5 operates to send the molten solder 7 in the pump 5 into the nozzle base portion 44. At this moment, the pump 5 supplies the molten solder 7 contained in the solder bath 4 under a predetermined pressure P to the branch ducts 14, 21 and the dummy nozzle 32 via the nozzle base portion 44. The molten solder 7 sent by the nozzle base portion 44 is spouted up to the upper portions of the nozzles 8a, 8a via the branch ducts 14 and is spouted up to the upper portions of the nozzles 16a, 16a via the branch ducts 21.

At this moment, to the nozzles 8a, 8a having the solder-spouting area S1, to the nozzle 8b having the solder-spouting area S2, to the nozzles 16a, 16a having the solder-spouting area S3 and to the nozzle 8b having the solder-spouting area S4, the molten solder 7 is respectively supplied under the pressure P and in respective ones, the molten solder 7 rises by its surface tension.

Here, the molten solder 7 raised by its surface tension in each of the nozzles 8a, 8a, 8b, 16a, 16a and 16b contacts the surface to be soldered in the printed circuit board 1. At this moment, the molten solder 7 in the nozzles 8a, 8b, 16a and 16b rises in the nozzles 8a, 8b, 16a and 16b by its surface tension and is drawn up to the soldering groups 3 in the printed circuit board 1 put on the nozzles 8a, 8b, 16a and 16b. By the pump 5, the pressure P is exerted so that the molten solder 7 is circulated in the nozzles 8a, 8b, 16a and 16b. It is thus possible to solder the electronic components to the surfaces to be soldered in the printed circuit board 1 with the molten solder 7.

On the other hand, the molten solder 7 supplied from the pump 5 under the pressure P is supplied to the dummy nozzle 32 that is positioned on a position which is nearer the pump 5 than the nozzles 8a, 8b, 16a and 16b, has the solder-spouting area S5 which is larger than the solder-spouting areas S1 through S4 of the nozzles 8a, 8b, 16a and 16b, and is connected to the nozzle base portion 44 via the nozzle plate 38 and the nozzle base 41, which contributes the adjustment of the spouted amount of the molten solder 7 supplied to the nozzles 8a, 8b, 16a and 16b.

At this moment, the molten solder 7 spouted from the nozzle base portion 44 through the branch ducts 14, 21 flows, after it contacts the printed circuit board 1, to a direction of the right drain portion 13 shown in FIG. 9 in the nozzles 8a having the drain portion 13 on one side thereof shown in FIG. 5 or it flows to directions of the both-sides drain portions 13, 13 as shown in FIG. 9 in the nozzles 16a having the drain portions 13 on both sides thereof as shown in FIG. 6.

In this example, even if the surface-mount components D and the connectors C are loaded on the rear surface of the printed circuit board 1 so that they are near the soldering groups 3, the spouted molten solder 7 does not contact the surface-mount components D and the connectors C absolutely because it does not flow outside the nozzles 8a, 8b, 16a and 16b.

When the molten solder 7 is spouted from the nozzles 8a, 8b, 16a and 16b while the printed circuit board 1 is put on the nozzles 8a, 8b, 16a and 16b, the molten solder 7 can only drain from the little drain portions 13 so that the pressure P within the nozzles 8a, 8b, 16a and 16b rises so that the molten solder 7 can enter into any through-holes.

Thus, if the solder is adhered to the surfaces (parts) to be soldered of the soldering groups 3, spouting it from the nozzles 8a, 8b, 16a and 16b is interrupted and the printed circuit board 1 is lifted upward on the nozzles 8a, 8b, 16a and 16b with it being held by the carrying chuck and at the same time, it is conveyed to a next cooling zone, not shown. The printed circuit board 1 cooled in the cooling zone is released from the carrying chuck at a predetermined position, which completes soldering.

Thus, according to the automatic partial-jet-soldering apparatus 100 as the embodiment, it is operated that when applying the molten solder 7 partially onto the printed circuit board 1 to solder the electronic components to the printed circuit board, the dummy nozzle 32 having the solder-spouting area S5 which is larger than the solder-spouting areas S1 through S4 of the nozzles 8a, 8b, 16a and 16b is connected to the nozzle base portion 44 via the nozzle plate 38 and the nozzle base 41 and the dummy nozzle 32 is positioned on a position which is nearer the pump 5 than the nozzles 8a, 8b, 16a and 16b and spouts the molten solder 7 supplied from the pump under the predetermined pressure P into opening portion.

Therefore, since the pressure variations in the molten solder 7 which the pump 5 exerts to the nozzles 8a, 8b, 16a and 16b can be absorbed by the dummy nozzle 32 having the solder-spouting area S5 which is larger than that of any of the nozzles 8a, 8b, 16a and 16b, it is possible for the dummy nozzle 32 to function as a preliminary jet nozzle for adjusting the spouted amount of solder (absorbing surge).

Accordingly, it is possible to provide the automatic partial-jet-soldering apparatus 100 which can spout the molten solder 7 partially onto the printed circuit board 1 in a stable state without decreasing the revolutions of the screw pump 5 which is difficult to set a spouted amount of solder, even if jet nozzles having the solder-spouting areas S1 through S4 that are very smaller than the solder-spouting area S5 of the dummy nozzle 32 accompanying with a miniaturization of electronic components. Further, since the dummy nozzle 32 is positioned at the section III that is adjacent to the pump 5 of the section II, it is possible to use all the section I widely as the partial-jet-soldering working area.

It is to be noted that the inventors verified operations by soldering the multilayer printed circuit board 1 to be used in a control panel for a high-precision processing machine using the automatic partial-jet-soldering apparatus 100 according to the invention. In the printed circuit board 1, electronic components such as PGA or a dual package were loaded on the surface thereof and the surface-mount components D and the connectors C were installed on the rear surface thereof but many through-holes were pierced therethrough. The leads of the PGA and dual packages were passed through the printed circuit board 1 from the surface thereof to the rear surface thereof so that on the rear surface thereof, many portions 2 to be soldered formed the soldering groups 3.

When observing the printed circuit board 1 after the soldering, no solder was adhered to the surface-mount components D and the connectors C on the rear surface thereof and the solder entered into the through-holes completely. By this operation verification, it was verified that when the output of the pump varied, the dummy nozzle 32 can absorb any variations in the pressure (vibrate a liquid surface) but a situation such that the molten solder 7 was spouted from the nozzles 8a, 8b, 16a and 16b in the solder bath 4 was not verified. Further, since a situation such that the molten solder 7 entered into jack insert holes inside the connector C was not verified so that there was no cause of bad contact. Still further, a situation such that the molten solder 7 was adhered to a surface of the printed circuit board 1 was not verified so that there was no cause of leakage.

Thus, even if the nozzles 8a, 8b, 16a and 16b used in the solder bath 4 are configured small so as to meet the miniaturization of electronic components, it was possible to decrease the variations in the pressure exerted to the nozzles 8a, 8b, 16a and 16b without decreasing the revolutions of the pump 5 by positioning the dummy nozzle 32 having the solder-spouting area S5 which is larger than that of any of the nozzles 8a, 8b, 16a and 16b near the pump 5, thereby enabling to be prevented a phenomenon such that the molten solder 7 is spouted from the nozzles 8a, 8b, 16a and 16b.

On the other hand, when soldering the same printed circuit board 1 in the conventional solder bath 4, it was verified that the solder was adhered up to undesired positions of the surface-mount components D and the connectors C which were loaded on the rear surface thereof and the solder did not enter into the through-holes satisfactorily.

Industrial Applicability

It is very preferable to apply this invention to the automatic partial-jet-soldering apparatus that spouts the molten solder to only desired positions in the printed circuit board and solders electronic components on the printed circuit board.

Description of Codes

4 . . . Solder Bath; 5 . . . Pump (Solder-Supplying Portion); 8a, 8b, 16a, 16b . . . Nozzles (First Jet Nozzles); 12, 18 . . . Wall Surfaces; 13 . . . Drain Portion; 14 . . . Branch Duct (Solder-Sending Path); 15 . . . Space; 31, 38 . . . Nozzle Plates; 32 . . . Dummy Nozzle; 44 . . . Nozzle Base Portion (Solder-Sending Path).

The invention claimed is:

1. A partial-jet-soldering device that applies molten solder partially onto a component-mounting member to solder an electronic component to the component-mounting member, the device comprising:
   a solder bath that has a solder-sending path and contains the molten solder;
   a solder-supplying portion that supplies the molten solder contained in the solder bath under a predetermined pressure to the solder-sending path;
   a first jet nozzle that has a predetermined solder-spouting area and connects the solder-sending path to spout the molten solder supplied from the solder-supplying portion under the predetermined pressure so that the solder rises by its surface tension; and
   a second jet nozzle that has a solder-spouting area more than that of the first jet nozzle and connects the solder-sending path to spout the molten solder supplied from the solder-supplying portion under the predetermined pressure,
   characterized in that the solder bath is composed of a container having a predetermined volume and an interior thereof is partitioned into a first section, a second section and a third section;
   the solder-sending path is positioned so that it is continuously communicated to the first, second and third sections in the interior of the container, at least the first section being positioned adjacent to the second section and the third section and allocated to a jet-soldering working area, nozzle bases being respectively positioned on the solder-sending paths of the first and third sections;
   the first jet nozzle is positioned on the nozzle base of the jet-soldering working area in the first section that is continuously communicated to the solder-sending path;
   the solder-supplying portion is positioned in the second section that is continuously communicated to the solder-sending path;
   the second jet nozzle is on the outside of the jet-soldering working area in the solder bath and is positioned on the nozzle base in the third section that is adjacent to the second section in which the solder-supplying portion is positioned;
   the first jet nozzle is separated from the second jet nozzle by an inner wall partitioning the first section from both the second section and the third section; and
   an axis part of the solder-supplying portion is at a greater distance from the first jet nozzle than from the second jet nozzle.

2. The partial-jet-soldering device according to claim 1, characterized in that the first jet nozzle has a same shape as a shape of a surface to be soldered of the component-mounting member.

3. The partial-jet-soldering device according to claim 1, characterized in that the second jet nozzle is positioned in the solder bath, outside of a surface to be soldered of the component-mounting member.

4. The partial-jet-soldering device according to claim 1, characterized in that a nozzle plate providing the first jet nozzle is provided in the solder bath, and
   the second jet nozzle is positioned on a position adjacent to the solder-supplying portion excepting the nozzle plate.

5. The partial-jet-soldering device according to claim 1, characterized in that the second jet nozzle is set so that it has a height that is identical to a height of the first jet nozzle on the basis of a predetermined surface or is more than this.

6. The partial-jet-soldering device according to claim 1, characterized in that for the second jet nozzle, a stainless material is used.

7. The partial-jet-soldering device according to claim 6, characterized in that for the second jet nozzle, a dummy nozzle in which nitriding is performed on the stainless material is used.

8. The partial-jet-soldering device according to claim 1, characterized in that an opening portion of the second jet nozzle is set so as to be shaped as an L-shape, a circular shape or a crosswise shape, in addition to a rectangular shape.

9. The partial-jet-soldering device according to claim 1, characterized in that for the solder-supplying portion, a pump of cylinder type, in which a baffle plate is not used, is used.

10. The partial-jet-soldering device according to claim 9, characterized in that for the pump of cylinder type, a screw pump is used.

11. A partial-jet-soldering method in which the solder bath having three sections, at least a first section being positioned adjacent to a second section and a third section, is allocated to a jet-soldering working area, a first jet nozzle having a predetermined solder-spouting area is positioned on a nozzle base of the first section that is continuously communicated to a solder-sending path in the solder bath, a solder-supplying portion is positioned in the second section that is continuously communicated to the solder-sending path, a second jet nozzle is positioned on a nozzle base in the third section that is adjacent to the second section in which the solder-supplying portion is positioned, and molten solder is partially applied onto a component-mounting member to solder an electronic component to the component-mounting member, wherein the first jet nozzle is separated from the second jet nozzle by an inner wall partitioning the first section from both the second section and the third section and an axis part of the solder-supplying portion is at a greater distance from the first jet nozzle than from the second jet nozzle, characterized in that the method comprises:
   a step of supplying the molten solder contained in a solder bath under a predetermined pressure from the solder-supplying portion to the solder-sending path, and
   on the one side, a step of raising the molten solder supplied from the solder-supplying portion via the solder-sending path under a predetermined pressure by its surface tension in a first jet nozzle and applying the molten solder onto a portion in which an electronic component is soldered to the component-mounting member, and
   on the other side, a step of supplying the molten solder from the solder-supplying portion via the solder-sending path under the predetermined pressure to the second jet nozzle that is on the outside of the jet-soldering working area, and is positioned on the nozzle base in the third section that is adjacent to the second section and has a solder-spouting area more than that of the first jet nozzle, raising the molten solder by its surface tension with the second jet nozzle and adjusting a spouted amount of the molten solder supplied to the first jet nozzle.

12. The method according to claim 11, wherein the component-mounting member includes a soldering group of component leads and the first jet nozzle has a shape that matches a shape of an area surrounding the soldering group of component leads.

13. The method according to claim 11, wherein the component-mounting member includes a soldering group of component leads and the second jet nozzle is positioned outside of an area surrounding the soldering group of component leads.

* * * * *